United States Patent
Spencer et al.

(10) Patent No.: US 11,260,705 B2
(45) Date of Patent: Mar. 1, 2022

(54) FLEXIBLE TIRE SENSOR UNIT

(71) Applicant: The Goodyear Tire & Rubber Company, Akron, OH (US)

(72) Inventors: Todd James Spencer, Hartville, OH (US); Gregory Alan Schessler, Stow, OH (US); Ryan Michael Schmidt, Wadsworth, OH (US); Benjamin John Iverson, Canton, OH (US); Xiaoping Yang, Streetsboro, OH (US)

(73) Assignee: The Goodyear Tire & Rubber Company, Akron, OH (US)

( * ) Notice: Subject to any disclaimer, the term of this patent is extended or adjusted under 35 U.S.C. 154(b) by 135 days.

(21) Appl. No.: 16/716,888

(22) Filed: Dec. 17, 2019

(65) Prior Publication Data

US 2021/0178836 A1    Jun. 17, 2021

(51) Int. Cl.
*B60C 23/04*    (2006.01)
*B60C 19/00*    (2006.01)

(52) U.S. Cl.
CPC ...... *B60C 23/0452* (2013.01); *B60C 23/0455* (2013.01); *B60C 23/0486* (2013.01); *B60C 2019/004* (2013.01)

(58) Field of Classification Search
CPC ............ B60C 23/0452; B60C 23/0455; B60C 23/0486; B60C 23/0493; B60C 2019/004
See application file for complete search history.

(56) References Cited

U.S. PATENT DOCUMENTS

| | | | |
|---|---|---|---|
| 4,609,905 A | 9/1986 | Uzzo | |
| 5,181,975 A | 1/1993 | Pollack | |
| 6,899,153 B1 * | 5/2005 | Pollack | B60C 23/0408 152/152.1 |
| 6,951,143 B1 | 10/2005 | Adderton et al. | |
| 7,523,656 B1 | 4/2009 | Blixhavn et al. | |
| 7,770,441 B2 | 8/2010 | Silverbrook et al. | |
| 9,174,500 B2 | 11/2015 | Won | |
| 9,908,374 B2 | 3/2018 | Dussinger et al. | |
| 10,082,381 B2 | 9/2018 | McMillen | |

(Continued)

FOREIGN PATENT DOCUMENTS

WO    2020026281 A1    2/2020

OTHER PUBLICATIONS

EPO search report issued by the EPO dated Apr. 20, 2021.

*Primary Examiner* — Orlando Bousono
(74) *Attorney, Agent, or Firm* — Edward T. Kennedy (57) ABSTRACT

A flexible sensor unit is embedded in a tire. The flexible sensor unit includes a plurality of individual circuit boards. Each circuit board includes at least one electronic component. The at least one electronic component includes a radio frequency identification integrated circuit, a microcontroller unit, at least one sensor, a power source and a boost converter. Each one of a plurality of electrically conductive flexible connecting ribbons extends between the circuit boards. An end ribbon is electrically connected to at least one of the circuit boards. An antenna is disposed on the end ribbon. The antenna transmits data from the at least one sensor, as processed by the microcontroller unit, and identification data from the radio frequency identification integrated circuit, to an external reader.

14 Claims, 6 Drawing Sheets

(56) References Cited

U.S. PATENT DOCUMENTS

| | | | |
|---|---|---|---|
| 2002/0140574 A1* | 10/2002 | Starkey | B60C 23/0479 |
| | | | 340/870.16 |
| 2003/0217797 A1 | 11/2003 | Poulbot et al. | |
| 2005/0110277 A1* | 5/2005 | Adamson | B60K 25/08 |
| | | | 290/1 R |
| 2007/0227644 A1 | 10/2007 | Fagot-revurat et al. | |
| 2009/0283891 A1 | 11/2009 | Dekker et al. | |
| 2012/0255349 A1* | 10/2012 | Pop | B60C 23/0452 |
| | | | 73/146.5 |
| 2015/0097662 A1 | 4/2015 | Yu et al. | |
| 2017/0206446 A1* | 7/2017 | Lesesky | G07C 5/008 |
| 2017/0250633 A1 | 8/2017 | Moiraghi et al. | |
| 2018/0241255 A1* | 8/2018 | Leabman | H02J 50/23 |

* cited by examiner

FLEXIBLE TIRE SENSOR UNIT

FIELD OF THE INVENTION

The invention relates to tires and monitoring systems for tires. More particularly, the invention relates to electronic sensors that sense various conditions within tires. Specifically, the invention is directed to a flexible sensor unit that may be embedded in a tire structure.

BACKGROUND OF THE INVENTION

Tires experience many conditions that are beneficial to monitor. Such tires include pneumatic tires, non-pneumatic tires, automotive tires, passenger tires, truck tires, commercial tires, off-the-road tires, aircraft tires, spacecraft tires, and the like. Reference herein is made generally to a tire by way of example, with the understanding that the invention applies to any type of tire.

In the manufacture of a pneumatic tire, the tire is typically built on the drum of a tire-building machine, which is known in the art as a tire building drum. Numerous tire components are wrapped about and/or applied to the drum in sequence, forming a cylindrical-shaped tire carcass. The tire carcass is then expanded into a toroidal shape for receipt of the remaining components of the tire, such as a belt package and a rubber tread. The completed toroidally-shaped unvulcanized tire carcass, which is known in the art at that stage as a green tire, is then inserted into a mold or press for forming of the tread pattern and curing or vulcanization.

For many modern tires, it is often desirable to mount electronic sensor units to the tires either before or after curing. Such sensor units enable temperature, pressure and/or other parameters or conditions of the tire to be continuously monitored during vehicle operation. The sensor units typically include an integrated circuit that processes and stores information. One or more sensors are integrated with or are electronically connected to the integrated circuit. An antenna for receiving and transmitting a signal to an external reader is also electronically connected to the integrated circuit, and may be carried on a substrate with the integrated circuit. Other electronic components, including power means such as a battery or energy harvesting structure, signal converters, and the like, are also typically integrated with the integrated circuit.

In the prior art, such electronic sensor units have often been attached to the inside surface of a pneumatic tire, which defines the cavity containing the inflation gas. Such a location has enabled the sensor unit to continuously sense parameters such as the temperature and pressure inside the tire cavity, while not interfering with the structure of the tire.

While such prior art sensor units are acceptable for many uses, it is desirable to monitor the actual temperature and other parameters at specific structural locations inside the tire structure during use on a vehicle, which cavity-based sensors cannot do. For example, monitoring the actual temperature at the edge of the belts in the belt package would be advantageous in predicting ongoing tire performance and potential tire replacement, as well as in providing immediate information to a driver or dispatcher to adjust the speed of a vehicle before potential thermal damage to the tire may occur. However, accurate measurement of the actual temperature at such a location requires the sensor unit to be permanently embedded into the tire structure.

In addition, as the demand for monitoring data increases, the size of the components of the sensor unit has often increased. For example, the sensor size has often increased in order to collect more data and/or monitor parameters with a greater sensitivity, power-related component size has increased due to increased power requirements for increased monitoring and transmission, and input/output component size has increased due to increased transmission timing and/or range.

Prior art embedded sensor units have experienced disadvantages, particularly with such increased component size requirements. More particularly, an integrated sensor unit on a single substrate is not flexible enough to be durably embedded inside the tire structure. Such prior art sensor units often undesirably experience detachment or cracking of components and/or the substrate during curing or operation of the tire, which shortens the life of the sensor unit.

As a result, it is desirable to develop a flexible sensor unit that may be embedded in a tire structure, which maintains durability of the tire and the life of the sensor unit, while also providing increased sensor functionality.

SUMMARY OF THE INVENTION

According to an aspect of an exemplary embodiment of the invention, a flexible sensor unit for embedding in a tire includes a plurality of individual circuit boards. Each circuit board includes at least one electronic component. The at least one electronic component includes a radio frequency identification integrated circuit, a microcontroller unit, at least one sensor, a power source and a boost converter. Each one of a plurality of electrically conductive flexible connecting ribbons extends between selected circuit boards. An end ribbon is electrically connected to at least one of the circuit boards, and an antenna is disposed on the end ribbon. The antenna transmits data from the at least one sensor, as processed by the microcontroller unit, and identification data from the radio frequency identification integrated circuit, to an external reader.

According to another aspect of an exemplary embodiment of the invention, a tire includes a flexible sensor unit. The tire and flexible sensor unit combination includes a tire, which in turn includes a pair of bead areas, a sidewall extending from each respective bead area to a tread, a carcass extending toroidally between each of the bead areas, and a belt reinforcement package disposed between the tread and the carcass. A flexible sensor unit is embedded in the tire. The flexible sensor unit includes a plurality of individual circuit boards. Each circuit board includes at least one electronic component. The at least one electronic component includes a radio frequency identification integrated circuit, a microcontroller unit, at least one sensor, a power source and a boost converter. Each one of a plurality of electrically conductive flexible connecting ribbons extends between selected ones of the circuit boards. An end ribbon is electrically connected to at least one of the circuit boards, and an antenna is disposed on the end ribbon.

Definitions

"Axial" and "axially" mean lines or directions that are parallel to the axis of rotation of the tire.

"Axially inward" and "axially inwardly" refer to an axial direction that is toward the axial center of the tire.

"Axially outward" and "axially outwardly" refer to an axial direction that is away from the axial center of the tire.

"Bead" means that part of the tire comprising an annular tensile member wrapped by ply cords and shaped, with or without other reinforcement elements such as flippers, chippers, apexes, toe guards and chafers, to fit the design rim.

"Carcass" means the tire structure apart from the belt structure, tread, undertread, and sidewall rubber over the plies, but including the beads.

"Circumferential" means lines or directions extending along the perimeter of the surface of the annular tread perpendicular to the axial direction.

"Cord" means one of the reinforcement strands of which the plies in the tire are comprised.

"Crown" means the section of the tread area between the shoulders of the tire.

"Equatorial plane (EP)" means the plane perpendicular to the tire's axis of rotation and passing through the center of its tread.

"Footprint" means the contact patch or area of contact created by the tire tread with a flat surface as the tire rotates or rolls.

"Groove" means an elongated void area in a tread that may extend in a circumferential, lateral or angled manner about the tread in a straight, curved, or zigzag configuration.

"Inboard side" means the side of the tire nearest the vehicle when the tire is mounted on a wheel and the wheel is mounted on the vehicle.

"Inner" means toward the inside of the tire.

"Innerliner" means the layer or layers of elastomer or other material that form the inside surface of a tubeless tire and that contain the inflating fluid within the tire.

"Lateral" and "laterally" are used to indicate axial directions across the tread of the tire.

"Outboard side" means the side of the tire farthest away from the vehicle when the tire is mounted on a wheel and the wheel is mounted on the vehicle.

"Outer" means toward the outside of the tire.

"Radial" and "radially" mean lines or directions that are perpendicular to the axis of rotation of the tire.

"Radially inward" and "radially inwardly" refer to a radial direction that is toward the central axis of rotation of the tire.

"Radially outward" and "radially outwardly" refer to a radial direction that is away from the central axis of rotation of the tire.

"Radial-ply tire" means a belted or circumferentially-restricted pneumatic tire in which the ply cords which extend from bead to bead are laid at cord angles between about 65 to about 90 degrees with respect to the equatorial plane of the tire.

"Rib" means a circumferentially extending strip of rubber on the tread which is defined by at least one circumferential groove and either a second such groove or a lateral edge, the strip being laterally undivided by full-depth grooves.

"Shoulder" means the region of the exterior of the tire formed by the joining of the tread and a sidewall.

"Tread" means a molded rubber component which includes that portion of the tire that comes into contact with the road when the tire is normally inflated and under normal load. The tread has a depth conventionally measured from the tread outer surface to the bottom of the deepest groove of the tire.

"Tread block" or "Tread element" means a rib or a block element defined by a shape having adjacent grooves.

BRIEF DESCRIPTION OF DRAWINGS

The invention will be described by way of example and with reference to the accompanying drawings, in which.

Similar numerals refer to similar parts throughout the drawings.

DETAILED DESCRIPTION OF THE INVENTION

Figure 1:
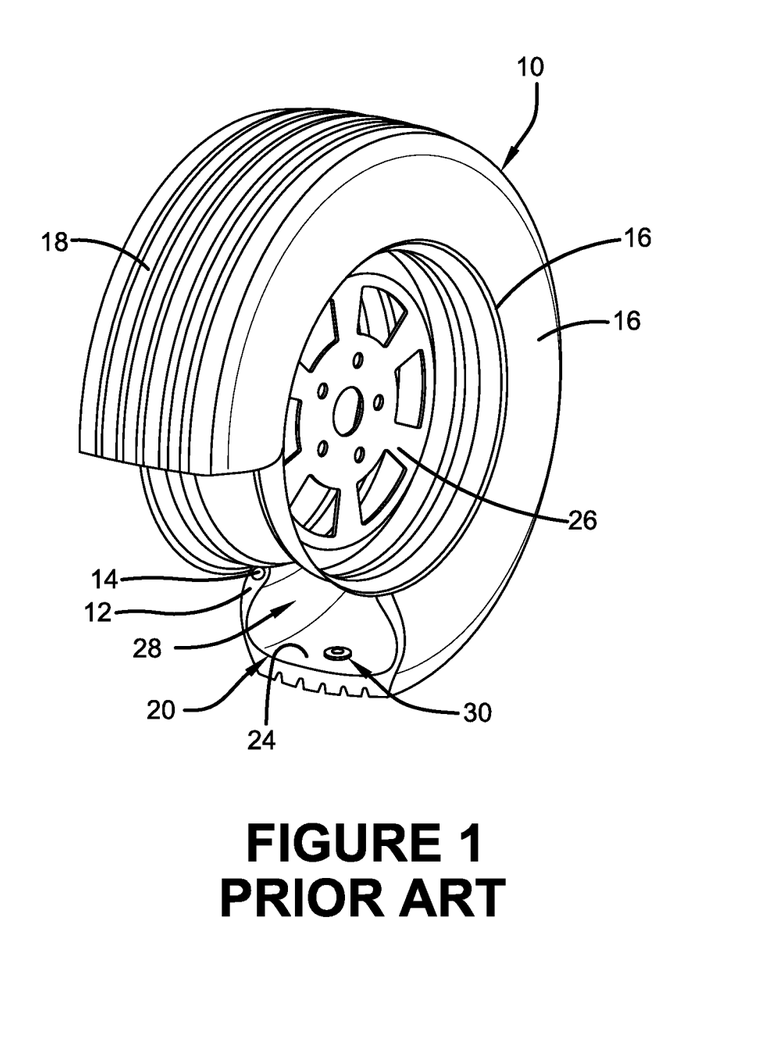
FIG. 1 is a perspective view of a tire, partially in section, with a cavity-mounted sensor unit of the prior art.

By way of introduction of the flexible sensor unit for a tire of the present invention, FIGS. 1 through 4 show a sensor construction of the prior art and a tire. Turning to FIG. 1, a tire 10 includes a pair of bead areas 12 (only one shown) and a bead core 14 embedded in each bead area. Each one of a pair of sidewalls 16 extends radially outward from a respective bead area 12 to a ground-contacting or ground-engaging tread 18. The tire 10 is reinforced by a carcass 20 that toroidally extends from one bead area 12 to the other bead area. The carcass 20 includes at least one ply 22 that preferably winds around each bead core 14. An innerliner 24 is formed on the inner or inside surface of the carcass 20. The tire 10 is mounted on the flange of a wheel or rim 26, as known in the art.

When the tire 10 is mounted on the wheel 26, a cavity 28 is formed and is filled with a pressurized fluid, such as air. An integrated sensor, such as a tire pressure monitoring system (TPMS) sensor unit 30, may be mounted on the innerliner 24 to measure the pressure and/or temperature in the cavity 28.

Figure 2:
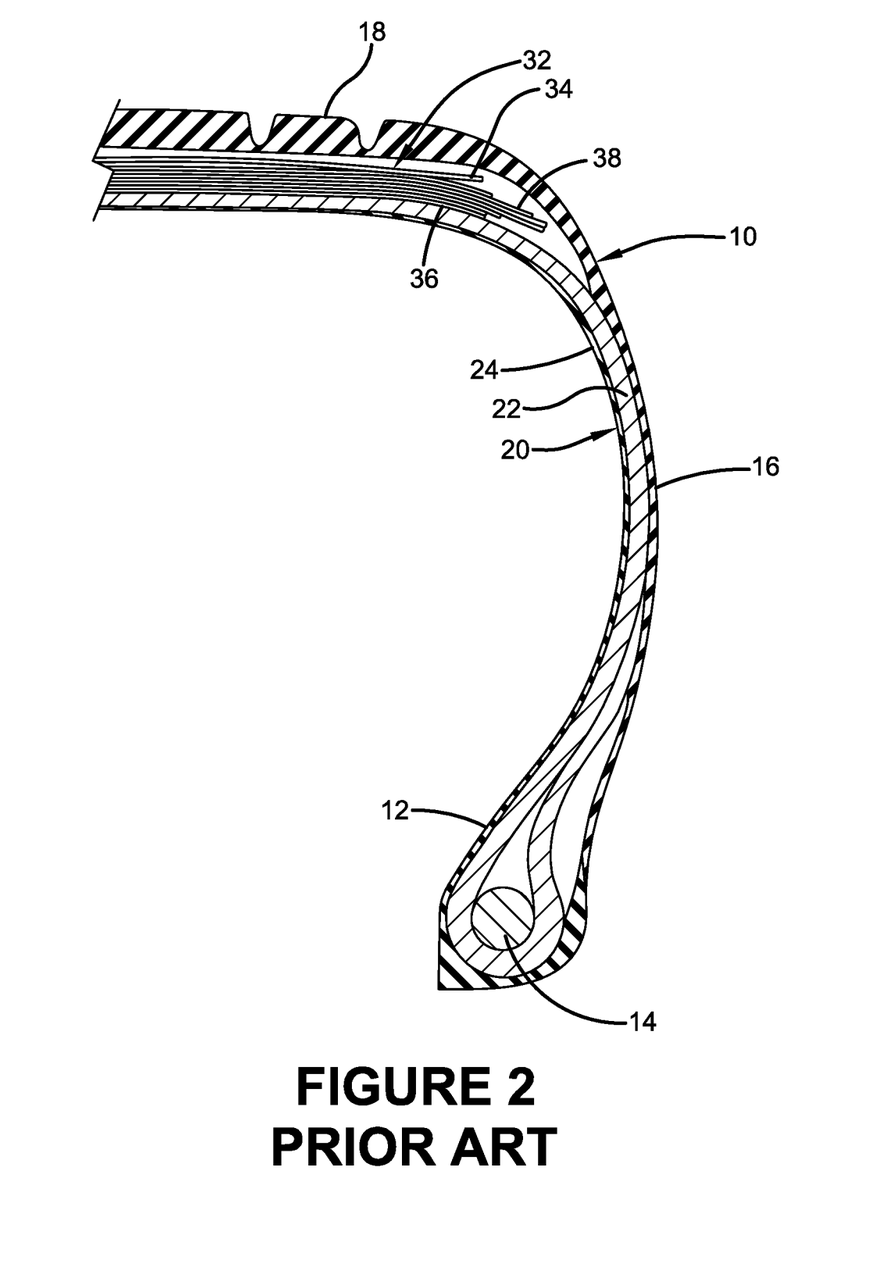
FIG. 2 is a partial cross-sectional view of the construction of the tire shown in FIG. 1.

As shown in FIG. 2, a belt reinforcement package 32 is disposed between the carcass 20 and the tread 18. The belt reinforcement package 32 may employ specific configurations as desired. For example, the belt reinforcement package 32 may include at least one of a radially outer belt structure 34 and a radially inner belt structure 36, and an intermediate belt structure 38 disposed between the radially outer belt structure and the radially inner belt structure.

As mentioned above, in the prior art, the integrated TPMS sensor unit 30 has been attached to the innerliner 24, which enables the sensor to continuously sense parameters such as the temperature and pressure inside the tire cavity 28, while not interfering with the structure of the tire 10. However, the TPMS sensor unit 30 cannot monitor the actual temperature and other parameters at specific structural locations inside the tire 10 during use on a vehicle, such as at the edge of the belts 34, 36 and 38 in the belt package 32.

Figure 3:
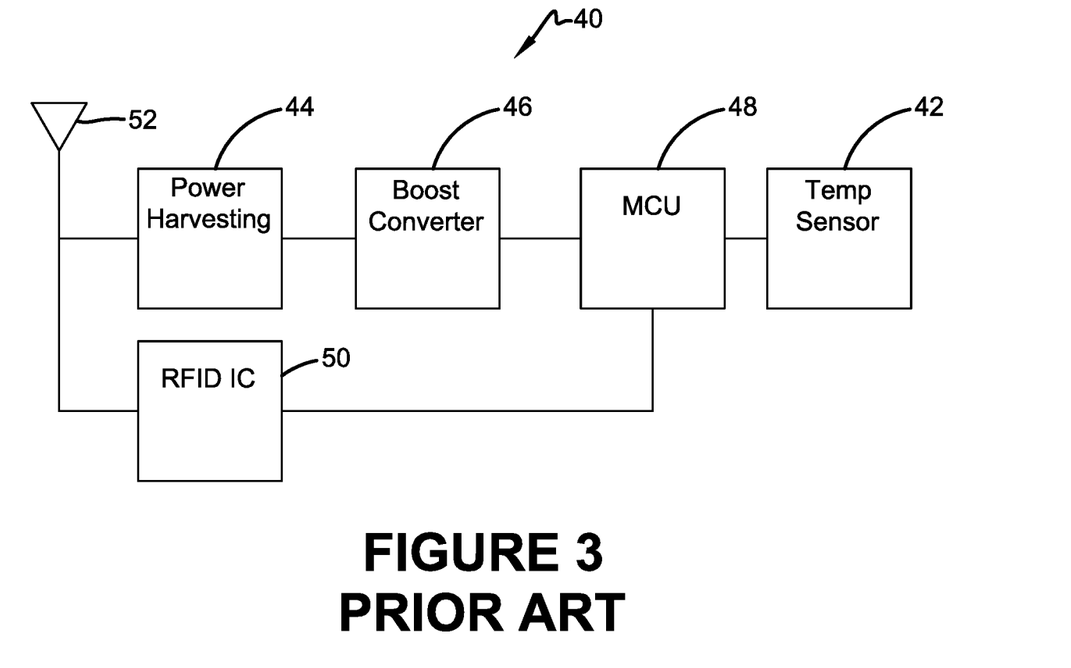
FIG. 3 is a block diagram of components of a prior art integrated sensor unit.
Figure 4:
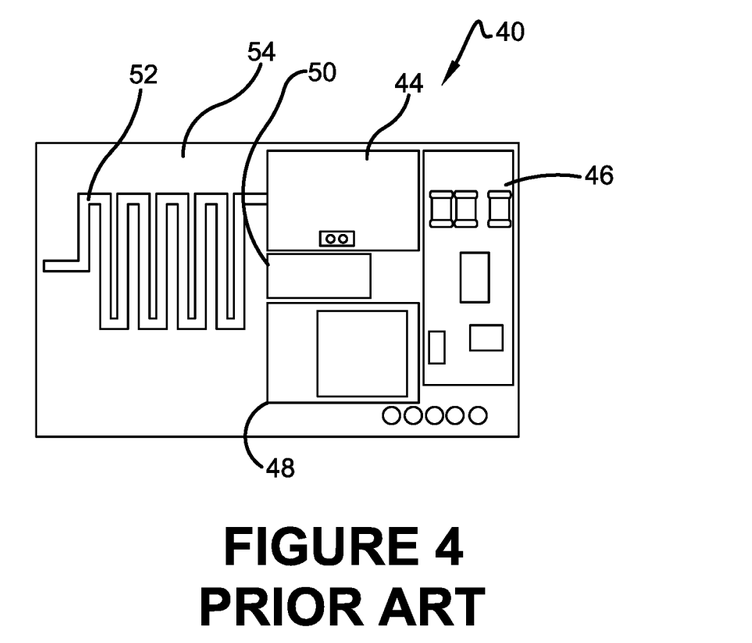
FIG. 4 is a plan view of the prior art integrated sensor unit shown in FIG. 3.

With reference to FIGS. 3 and 4, a prior art sensor unit 40 that may be embedded in the structure of the tire 10 (FIG. 2) is shown. The prior art sensor unit 40 has been disposed between the belt package 32 and the tread 18, between the belt package and the carcass 20, or between belts 34, 36 and/or 38 within the belt package. The prior art sensor unit 40 includes a single substrate 54 on which electronically interconnected components are formed.

For example, the prior art sensor unit 40 includes a temperature sensor 42 and a power source 44, such as an energy or power harvesting unit. A boost converter 46, which is a power converter that adjusts voltage and/or current between the power source 44 and the temperature sensor 42 and other powered components, is also included. A microcontroller unit (MCU) 48 receives the data from the temperature sensor 42 and processes it for transmission. A radio frequency identification (RFID) integrated circuit 50 includes information to identify the sensor unit 40. An antenna 52 transmits data from the sensor unit 40 to an external reader and/or processor, as known to those skilled in the art.

As mentioned above, the prior art integrated sensor unit 40, which includes a single substrate 54, is not flexible enough to be durably embedded inside the structure of the tire 10. Such prior art sensor units 40 often undesirably experience detachment or cracking of components and/or the substrate 54 during curing or operation of the tire 10, which shortens the life of the sensor unit.

Turning to FIGS. 5 through 8 an exemplary embodiment of a flexible sensor unit for a tire of the present invention is indicated at 100. The flexible sensor unit 100 is a segmented sensor unit that is made up of individual circuit boards 102 which are electronically connected to one another by electrically conductive flexible connecting traces or ribbons 104. Preferably, each circuit board 102 is made of a resilient yet compliant material, such as a multi-layer flexible polyimide and/or fiberglass. The material that is employed may dictate the components that are disposed on each circuit board 102. For example, a multi-layer flexible polyimide may be less densely populated to retain flexibility, while fiberglass may be more densely populated to reduce the footprint of the circuit board and thereby minimize stresses on components. The connecting ribbons 104 preferably are made of single-layer polyimide to provide flexibility and electrical conductivity.

Figure 5:
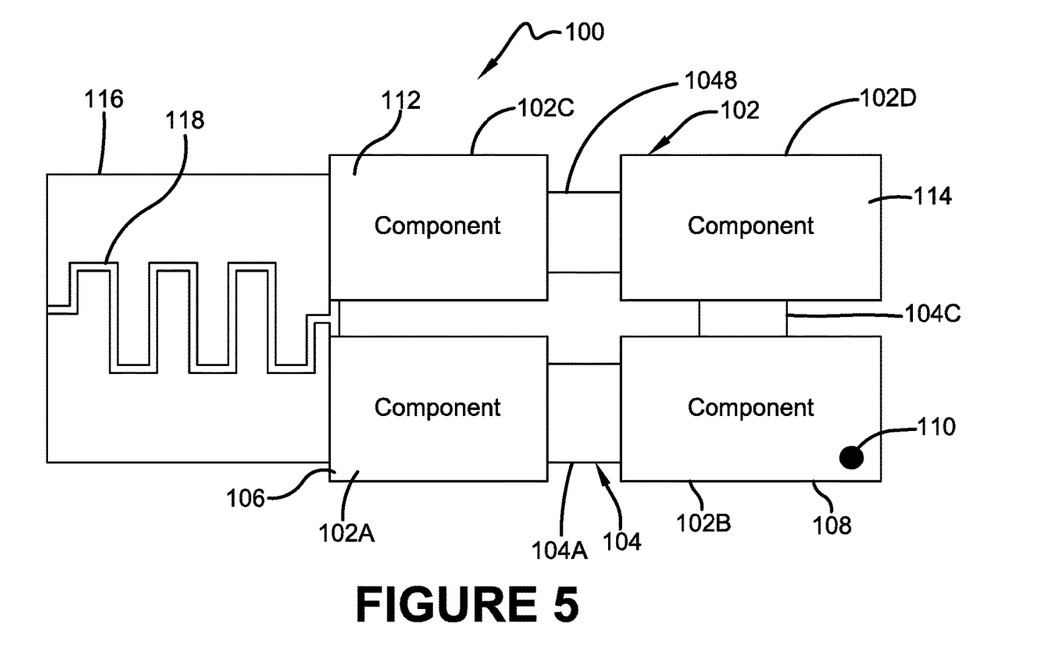
FIG. 5 is a plan view of an exemplary embodiment of a flexible sensor unit for a tire of the present invention.
Figure 6:
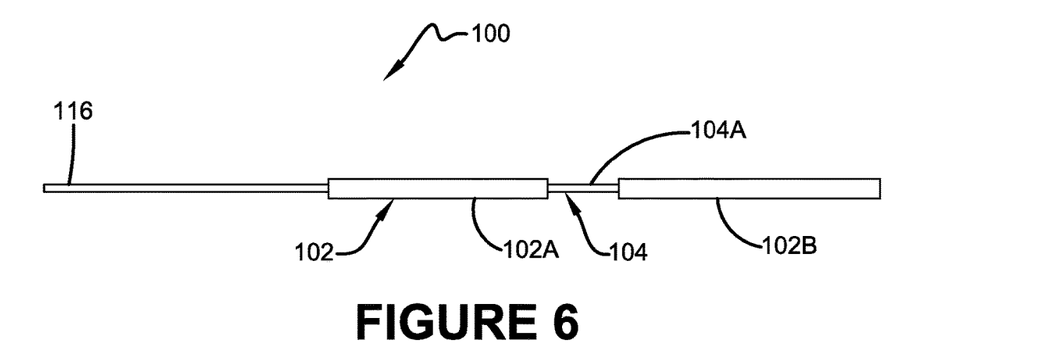
FIG. 6 is an elevational view of the flexible sensor unit shown in FIG. 5.
Figure 7:
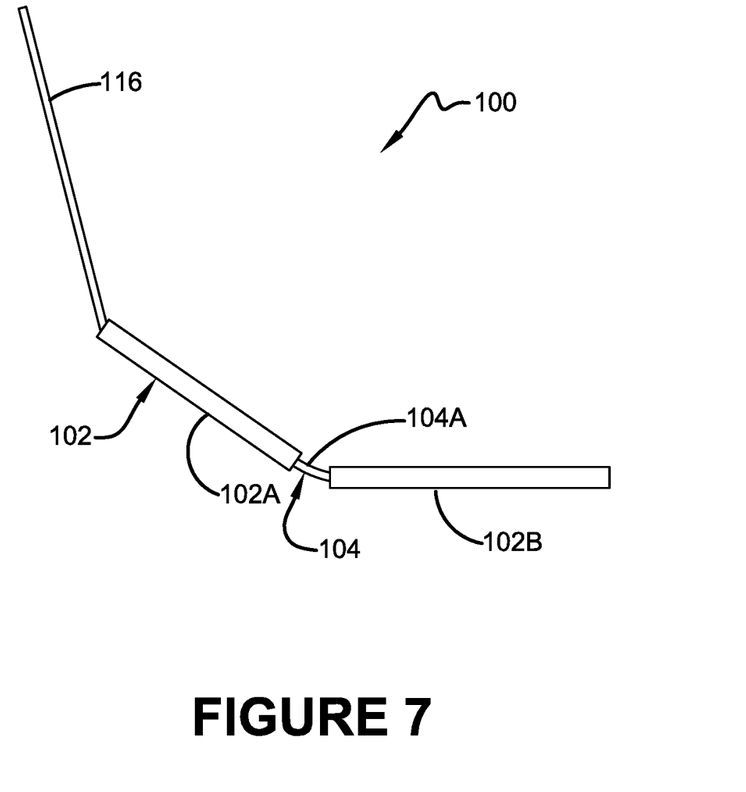
FIG. 7 is an elevational view of the flexible sensor unit shown in FIG. 5, shown in a flexed position.

Preferably, each circuit board 102 is formed with specific electronic components. For example, a first circuit board 102A may include a radio frequency identification (RFID) integrated circuit 106. A second circuit board 102B may include a microcontroller unit 108 and at least one sensor 110. A third circuit board 102C may include a power source 112. A fourth circuit board 102D may include a boost converter 114.

A first ribbon 104A electrically connects the first circuit board 102A, which contains the RFID integrated circuit 106, and the second circuit board 102B, which contains the microcontroller unit 108 and the sensor 110. A second ribbon 104B electrically connects the third circuit board 102C, which contains the power source 112, and the fourth circuit board 102D, which contains the boost converter 114. A third ribbon 104C electrically connects the second circuit board 102B and the fourth circuit board 102D.

An end ribbon 116 preferably is disposed on one end of the flexible sensor unit 100. The end ribbon 116 preferably is made of flexible single-layer polyimide. Disposed on the end ribbon 116 is an antenna 118. The antenna 118 is electronically connected to the first circuit board 102A, which contains the RFID integrated circuit 106, and to the third circuit board 102C, which contains the power source 112.

As mentioned above, the first circuit board 102A may include the RFID integrated circuit 106. The RFID integrated circuit 106 includes information to identify the sensor unit 100 and a tire 120 in which the sensor unit is embedded. Such identification information may include manufacturing information for the tire 120, such as: the tire type; tire model; size information, such as rim size, width, and outer diameter; manufacturing location; manufacturing date; a treadcap code that includes or correlates to a compound identification; and a mold code that includes or correlates to a tread structure identification. The tire identification enables correlation of data gathered by the sensor 110 with the specific tire 120 to provide local or central tracking of the tire, its current condition, and/or its condition over time. The RFID integrated circuit 106 transmits data gathered by the sensor 110 and processed by the microcontroller unit 108 through a radio frequency signal using the antenna 118.

Also as mentioned above, the second circuit board 102B may include the microcontroller unit 108 and the sensor 110. The microcontroller unit 108 processes and stores data from the sensor 110. The sensor 110 is electronically connected to the microcontroller unit 108, and may be integrated into the microcontroller unit. The sensor 110 preferably is a temperature sensor that measures the temperature of the tire structure in the region where the sensor is embedded, as will be described in greater detail below. Additional sensors 110 may be employed, and may include one or more of a pressure sensor to measure a pressure of the structure of the tire 120, a wear sensor to measure wear of the tire, a force sensor to measure forces on the tire, a strain sensor to measure strains on the tire, and an acceleration sensor to measure acceleration of the tire.

The third circuit board 102C includes the power source 112 for the sensor unit 100. Preferably, the power source 112 is an energy harvesting or power harvesting unit with a wireless power receiver that may be configured to receive a radio frequency power signal through the antenna 118. The radio frequency power signal may be an ultra high frequency (UHF) signal in a range of from about 300 megahertz (MHz) to about 3 gigahertz (GHz). The power source 112 optionally includes a non-rechargeable battery, a rechargeable battery and/or a capacitor to store energy for the sensor unit 100.

The fourth circuit board 102D includes the boost converter 114. The boost converter 114 converts voltage and/or current from the power source 112 to an acceptable level for the sensor 110, microcontroller unit 108, and the RFID integrated circuit 106.

The antenna 118 is formed on the end ribbon 116, and is flexible, which enables the sensor unit 100 to be embedded in the tire 120, as will be described in greater detail below. The antenna 118 transmits data from the sensor 110, as processed by the microcontroller unit 108, and identification data from the RFID integrated circuit 106, to an external reader for processing and/or storage. The antenna 118 may also receive signals to actuate the sensor unit 100, and may receive a radio frequency power signal for the power source 112.

The flexible sensor unit 100 may be a passive radio frequency unit that is actuated by the external reader. More particularly, the sensor 110, the microcontroller unit 108, and the RFID integrated circuit 106 may remain in a passive state. When the external reader is in proximity with the sensor unit 100, the antenna 118 receives a wireless signal from the reader that actuates the sensor 110, the microcontroller unit 108, and the RFID integrated circuit 106. The sensor 110 takes its respective measurements, and data from the sensor measurements is processed by the microcontroller unit 108. The data is stored in the microcontroller unit 108 and/or the RFID integrated circuit 106 and transmitted wirelessly by the antenna 118 from the sensor unit 100 to the external reader. Alternatively, the sensor 110 may be powered by the power source 112 to take measurements at predetermined intervals, which are processed by the microcontroller unit 108 and are transmitted with identification information from the RFID integrated circuit 106 by the antenna 118 when the sensor unit 100 is in proximity with the external reader.

Figure 8:
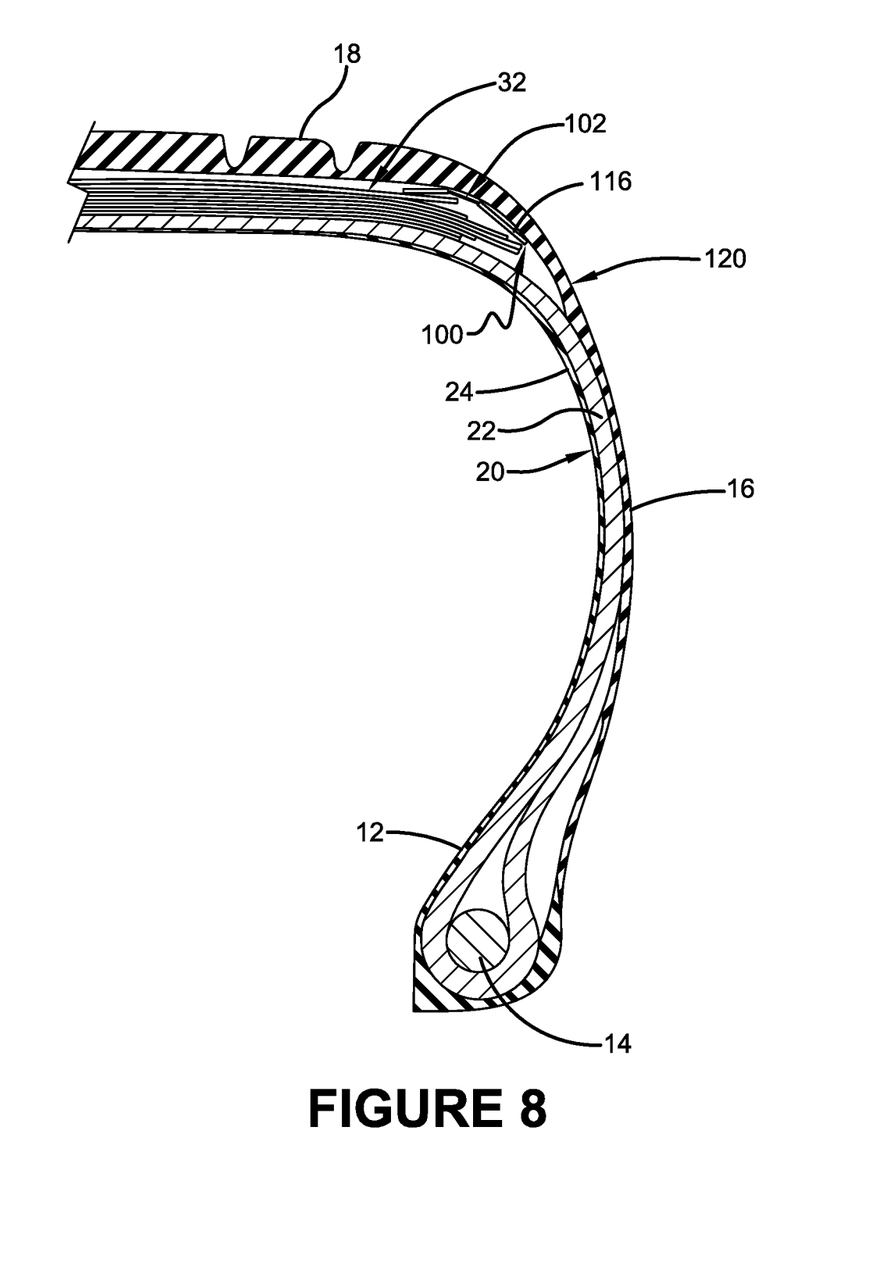
FIG. 8 is a partial cross-sectional view of the construction of a tire, with the flexible sensor unit shown in FIG. 5 embedded in the tire structure.

With particular reference now to FIG. 8, the above-described structure of the flexible sensor unit 100 enables the unit to be inserted into a specific structural location in the tire 120 before curing. In such a case, and when the sensor 110 is a temperature sensor, the sensor unit 100 may optionally be employed to detect temperature profiles within the tire 120 during curing. In such a case, the flexible sensor unit 100 may be disposed in the last part of the tire 120 to cure, which is referred to as the point of least cure. By being located at the point of least cure in the tire 120, the sensor unit 100 may measure the actual integrated time and temperature history during the curing of the tire, which may be used to control the cycle time of the curing press. Such a measurement of actual temperature at the point of least cure of the tire 120 by the sensor unit 100 may be more reliable than prediction techniques. In addition, because prediction techniques often add more curing time as a precautionary factor, measurement of actual temperature with the sensor unit 100 may reduce the curing time that is required for the tire 120, thereby increasing the efficiency of the curing process.

Once the tire 120 is cured, the flexible sensor unit 100 is permanently disposed at its selected location inside the tire. The segmented construction of the sensor unit 100, including the resilient circuit boards 102 that are interconnected by flexible ribbons 104, enables placement of the sensor unit in the tire 120 without damage to the structural components of the tire.

The flexible sensor unit 100 may also be employed, when the sensor 110 is a temperature sensor, to detect temperature within the tire 120 during its use on a vehicle. For example, the sensor unit 100 may be disposed at the edge of the belt reinforcement package 32 to measure the belt edge temperature. Belt edge temperature is often an indicator of performance and/or life issues for the tire 120, and by detecting temperature in the structure at the edge of the belt reinforcement package 32, the flexible sensor unit 100 provides data indicating when tire replacement is recommended. The flexible sensor unit 100 may also track a temperature versus time history at a specific location, such as the belt edge or a belt splice, in order to provide data to predict when tire replacement should occur. Moreover, the flexible sensor unit 100 may be disposed in other structural areas of the tire 120 to monitor temperatures at those locations when the sensor 110 is a temperature sensor.

In this manner, the flexible sensor unit 100 provides a structure that may be embedded in a tire 120, and maintains durability of the tire and the life of the sensor unit, while also providing increased sensor functionality. The segmented construction of the sensor unit 100, including the resilient circuit boards 102 that are interconnected by flexible ribbons 104 provides increased structural flexibility, as well as modularity of components. The segmented construction of the sensor unit 100 also prevents structural issues within the tire 120.

The present invention also includes a method of forming a tire 120 with a flexible sensor unit 100. The method includes steps in accordance with the description that is presented above and shown in FIGS. 5 through 8.

It is to be understood that the structure of the above-described flexible sensor unit 100 and/or the tire 120 in which the sensor unit is embedded may be altered or rearranged, or components or steps known to those skilled in the art omitted or added, without affecting the overall concept or operation of the invention. For example, the flexible sensor unit 100 may be disposed in any location in the tire 120, more than one flexible sensor unit may be disposed in the tire, and electronic structures and/or types of sensors 110 other than those described above may be connected to or integrated into the flexible sensor unit. In addition, the invention applies to any type of tires, including pneumatic tires, non-pneumatic tires, automotive tires, passenger tires, truck tires, commercial tires, off-the-road tires, aircraft tires, spacecraft tires, and the like.

The invention has been described with reference to a preferred embodiment. Potential modifications and alterations will occur to others upon a reading and understanding of this description. It is to be understood that all such modifications and alterations are included in the scope of the invention as set forth in the appended claims, or the equivalents thereof.

What is claimed is:

1. A flexible sensor unit for embedding in a tire, the flexible sensor unit comprising:
   a plurality of individual, physically separate circuit boards;
   each circuit board including at least one electronic component, the at least one electronic component including at least one of a radio frequency identification integrated circuit, a microcontroller unit, at least one sensor, a power source and a boost converter;
   a plurality of electrically conductive flexible connecting ribbons, each connecting ribbon extending between and electrically connecting selected ones of the circuit boards, wherein the flexible connecting ribbons enable the at least one sensor to flex between the circuit boards;
   an end ribbon being electrically connected to at least one of the circuit boards; and
   an antenna being disposed on the end ribbon, whereby the antenna transmits data from the at least one sensor, as processed by the microcontroller unit, and identification data from the radio frequency identification integrated circuit, to an external reader.

2. The flexible sensor unit of claim 1, wherein the at least one sensor includes a temperature sensor.

3. The flexible sensor unit of claim 1, wherein each circuit board is made of a multi-layer, flexible polyimide.

4. The flexible sensor unit of claim 1, wherein each circuit board is made of fiberglass.

5. The flexible sensor unit of claim 1, wherein the connecting ribbons are made of a single-layer polyimide.

6. The flexible sensor unit of claim 1, wherein the end ribbon is made of a single-layer polyimide.

7. The flexible sensor unit of claim 1, wherein a first one of the circuit boards includes the radio frequency identification integrated circuit, a second one of the circuit boards includes the microcontroller unit and the at least one sensor, a third one of the circuit boards includes the power source, and a fourth one of the circuit boards includes the boost converter.

8. The flexible sensor unit of claim 7, wherein a first ribbon electrically connects the first one of the circuit boards and the second one of the circuit boards, a second ribbon electrically connects the third one of the circuit boards and the fourth one of the circuit boards, and a third ribbon electrically connects the second one of the circuit boards and the fourth one of the circuit boards.

9. The flexible sensor unit of claim 7, wherein the antenna is electronically connected to the first one of the circuit boards and to the third one of the circuit boards.

10. The flexible sensor unit of claim 1, wherein the identification data from the radio frequency identification integrated circuit includes information to identify the sensor unit and a tire in which the sensor unit is embedded.

11. The flexible sensor unit of claim 1, wherein the at least one sensor includes at least one of a pressure sensor, a wear sensor, a force sensor, a strain sensor, and an acceleration sensor.

12. The flexible sensor unit of claim 1, wherein the power source includes an energy harvesting unit.

13. The flexible sensor unit of claim 12, wherein the energy harvesting unit includes a wireless power receiver that receives a radio frequency power signal through the antenna.

14. The flexible sensor unit of claim 1, wherein the power source includes at least one of a non-rechargeable battery, a rechargeable battery and a capacitor.

* * * * *